United States Patent
Wolter

(10) Patent No.: US 9,136,732 B2
(45) Date of Patent: Sep. 15, 2015

(54) DISTRIBUTED ENERGY STORAGE AND POWER QUALITY CONTROL IN PHOTOVOLTAIC ARRAYS

(71) Applicant: James F Wolter, Spring Lake, MI (US)

(72) Inventor: James F Wolter, Spring Lake, MI (US)

( * ) Notice: Subject to any disclaimer, the term of this patent is extended or adjusted under 35 U.S.C. 154(b) by 340 days.

(21) Appl. No.: 13/651,445

(22) Filed: Oct. 14, 2012

(65) Prior Publication Data

US 2014/0103855 A1  Apr. 17, 2014
US 2015/0008864 A2  Jan. 8, 2015

Related U.S. Application Data

(60) Provisional application No. 61/547,689, filed on Oct. 15, 2011.

(51) Int. Cl.
*H02J 7/00* (2006.01)
*H02J 7/35* (2006.01)
*H02J 3/32* (2006.01)

(52) U.S. Cl.
CPC ... *H02J 7/35* (2013.01); *H02J 3/32* (2013.01); *Y02B 10/14* (2013.01); *Y02E 10/566* (2013.01)

(58) Field of Classification Search
None
See application file for complete search history.

(56) References Cited

U.S. PATENT DOCUMENTS

| | | | |
|---|---|---|---|
| 5,327,071 A * | 7/1994 | Frederick et al. | 323/299 |
| 7,400,149 B2 * | 7/2008 | Koster et al. | 324/429 |
| 7,964,787 B2 | 6/2011 | Jaisinghani | |
| 8,013,566 B2 | 9/2011 | Haines | |
| 8,093,756 B2 | 1/2012 | Porter et al. | |
| 8,242,634 B2 * | 8/2012 | Schatz et al. | 307/82 |
| 8,471,408 B2 * | 6/2013 | Bundschuh et al. | 307/80 |
| 2009/0189445 A1 * | 7/2009 | Strizki | 307/21 |
| 2010/0198421 A1 * | 8/2010 | Fahimi et al. | 700/291 |
| 2010/0213761 A1 * | 8/2010 | McDonald et al. | 307/18 |
| 2010/0231045 A1 | 9/2010 | Collins et al. | |
| 2011/0089886 A1 * | 4/2011 | Dubovsky | 320/101 |
| 2011/0115292 A1 | 5/2011 | Yoneda et al. | |
| 2011/0140520 A1 | 6/2011 | Lee | |
| 2011/0148360 A1 | 6/2011 | Lee | |
| 2011/0165441 A1 | 7/2011 | Genies et al. | |
| 2011/0193515 A1 | 8/2011 | Wu et al. | |
| 2011/0221269 A1 | 9/2011 | Borger et al. | |
| 2011/0245987 A1 | 10/2011 | Pratt et al. | |
| 2011/0291480 A1 | 12/2011 | Nair et al. | |
| 2011/0296218 A1 | 12/2011 | Kim et al. | |
| 2012/0176079 A1 * | 7/2012 | Nakashima et al. | 320/101 |
| 2012/0215367 A1 * | 8/2012 | Eizips et al. | 700/286 |
| 2012/0286574 A1 * | 11/2012 | Sawada et al. | 307/23 |
| 2013/0009463 A1 * | 1/2013 | Iwasaki et al. | 307/9.1 |
| 2013/0181527 A1 * | 7/2013 | Bhowmik | 307/63 |

(Continued)

*Primary Examiner* — Leigh Garbowski
(74) *Attorney, Agent, or Firm* — James E. Shultz, Jr.

(57) ABSTRACT

A solar electric system comprises photovoltaic elements having integrated energy storage and control, ideally on each PV-panel. The energy storage media may be primary or secondary cylindrical cells interconnected into a battery and/or an array of capacitors (or super-capacitors) and are accompanied by an electronic control circuit which may perform a variety of functions, including but not limited to: power quality control, load following, pulse powering, active line transient suppression, local sensing, remote reporting, wireless or wired communications allowing two way programmable control through local or remote operation. The operation of the system may yield direct current or with the integration of bidirectional micro-inverters create distributed alternating current generation enhanced with energy storage and control two way energy flows between the solar system and the grid.

35 Claims, 3 Drawing Sheets

(56) References Cited

U.S. PATENT DOCUMENTS

2013/0257164 A1* 10/2013 Garrity et al. .................. 307/82
2014/0060100 A1* 3/2014 Bryson ........................ 62/235.1
2014/0062191 A1* 3/2014 Bryson .......................... 307/26
2014/0062206 A1* 3/2014 Bryson .......................... 307/80
2015/0028692 A1* 1/2015 Makhota et al. ............... 307/115
2015/0117067 A1* 4/2015 Naiknaware et al. ...... 363/21.04

* cited by examiner

DISTRIBUTED ENERGY STORAGE AND POWER QUALITY CONTROL IN PHOTOVOLTAIC ARRAYS

CROSS REFERENCE TO RELATED APPLICATION

This application claims benefit under 35 U.S.C. Section 111(e) of provisional application Ser. No. 61/547,689 filed Oct. 15, 2011 entitled DISTRIBUTED ENERGY STORAGE AND CONTROL IN PHOTOVOLTAIC ARRAYS, the essential content of which is incorporated herein.

BACKGROUND OF THE INVENTION

The present invention relates to photovoltaic (PV) solar electric power systems and concentrated photovoltaic (CPV) solar electric power systems, and more particularly to direct-conversion, photovoltaic solar-electric systems having energy storage and power-quality control devices physically mounted on, and electrically integrated with individual PV-panels, single CPV devices, limited numbers of panels as may be in close physical proximity (for example, on a single PV-panel, a mounting structure holding a plurality of such PV panels and interconnected electrically, or integrated into a single "string" which has the purpose of creating a desired "take-off voltage" (such as 1000VDC nominal for example) at combiner box locations. For definitional clarification, "electrical energy storage" devices as applied herein are intended to include but not be restricted to primary or secondary electrochemical batteries, capacitive devices where electrical energy is stored in dielectric charge displacement, electric double layer capacitors (super capacitors or lithium-ion capacitors), or new and as yet un-named quantum-nano-structure devices which store electrons associatively and exhibit the electrical characteristics of both batteries and super-capacitors.

SUMMARY OF THE PRESENT INVENTION

In one aspect of the present invention, a solar panel or thin-film PV-laminate may have a single cell or primary or secondary battery, optionally paired with a battery management system to control the primary battery's discharge or the secondary battery's charge, float, or discharge functions affixed to the solar panel. This application also admits the use of a capacitive energy storage technology, or a nano-structured device that combines both electro-chemical (battery) and charge retaining (capacitor) energy storage capabilities in use singly or in combination with battery devices. Such an energy storage enhanced PV device may be used singly or in string-combinations to meet various direct current loads (or alternating current loads when integrated with micro-inverters' electrical load requirements). Depending upon the application needs, these systems could use individual charge controllers to maintain isolated control of the battery or capacitor on each panel, or in more advanced control schemes, employ digital control signals from an external, integrative logic-control information processing control (computer) which could either be sent to panels or combinations of panels using wireless or superimposed carrier current radio frequency communications.

In another aspect of this invention, a number of solar panels combined in a string may have a common connection called a combiner-box containing batteries or capacitors to provide energy storage and power management at the string-level within a larger array of solar panels.

In another aspect of this invention a solar panel combined with a battery and a micro-inverter can provide for an augmented "AC" panel's utility by providing load leveling and after "solar-hours" power to their load. The micro-inverter's internal circuitry can be readily augmented with the necessary logic and power control elements to control the charging, discharging, "gas-gauge", cycle history, diagnostics, and reporting functions to display and manage stored energy at a master-system level. These micro-inverters now have advanced sensing, control, reporting, and diagnostics functions for the solar-PV function which can be enhanced by adding energy storage capabilities to the individual panel/micro-inverter unit. This augmentation creates a stored energy utility to "AC" panel systems which enables load-following and load-leveling capabilities which cannot be provided by a collection of micro-inverters alone. This configuration preserves the advantage of having short D.C.-links in the power system and utilizes the existing distributed inverter system to provide solar plus stored energy power operation of the system.

In another aspect of the invention, advantage is taken of configuring A.C. panels such that systems integration is simplified to various transformer interconnections and power distribution panels and A.C. wiring and large central inverters are eliminated altogether. If bidirectional micro inverters are used such that AC-power and information flows both from the solar power system to the grid 41 and from the grid 41 back to individual power units, the net-benefit of having energy storage within the system combined with smart-control adapts the system to "smart-grid" control for use by a larger power provider (a Utility or smaller distributed, community energy storage system in an AC micro-grid).

In another aspect of this invention, conventional framed PV panel installations can become distributed energy generation and energy storage on a string-by-string basis and eliminate the need for central battery-banks and in the cases of using micro-inverters, central inverters would also be eliminated. Ideally the level of integration would be determined by the independent mounting systems employed in the larger system and connections would still be made in conventional combiner boxes. As micro-inverters become more powerful—it may become convenient to move distributed energy storage, micro-inversion, and control to the combiner box itself.

These and other features, advantages, and objects of the present invention will be further understood and appreciated by those skilled in the art by reference to the following specification, claims, and drawings.

BRIEF DESCRIPTION OF THE DRAWINGS

FIG. 6. Translates FIG. 5 into an electronic schematic showing how the power switching would be accomplished using MOSFET devices controlled by an Application Specific Integrated Circuit (ASIC) which would use custom software written specifically for the desired functions of power management desired. Logic-Inputs to the microprocessor are numerous (shown as 36a . . . 36n) so as to allow this power system to cooperate in fulfilling the various requirements of power quality management discussed elsewhere in this application. The low cost of custom microprocessors now allow very high degrees of logic control which support the goal of having many, distributed power systems each associated with a single or a few solar panels which employ distributed (micro-inverters) for D.C. to A.C. conversion so as to simplify the collection of power and the enhanced utility of having directly useable, Utility interconnect quality power which can be directly connected to a user's existing A.C. power distribution panel or exported to a Utility grid 41. Depending upon the sizing of the energy storage module, systems can offer all of the aforementioned benefits of load-leveling, peak shaving, and nighttime power availability from the solar system apply greatly enhancing the overall utility and broadening the usefulness of their A.C. solar system.

DETAILED DESCRIPTION OF THE PREFERRED EMBODIMENTS OF THE INVENTION

Figure 1:
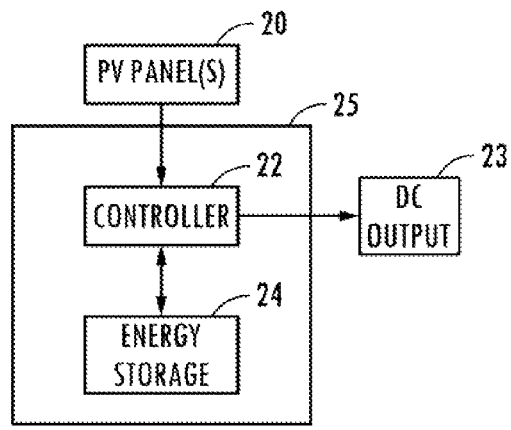
FIG. 1. is a schematic (block diagram) showing how a single panel or solar laminate would be configured by physically mounting a rechargeable battery pack containing a number of inter-connected cells and/or an electrical capacitor pack having an operating voltage compatible with the loaded voltage-range of the photovoltaic panel. Also shown is a battery management controller which could be as simple as a charge control device or as sophisticated as being a battery management system with multi-functionality.

Whether employed with individual solar panels, strings of solar panels or proximal clusters of CPV elements, the purpose of this invention is for at least one or a plurality of PV-panel mounted distributed energy storage and smart-control elements to function collectively to optimally store and release energy in voltage and current controlled amounts and times as may be driven by microcircuit logic using programmed algorithms to solve a constellation of problems relating to power availability and power quality in an electrical supply system connected to the described solar power system. This invention has several aspects which when used singly or in combination will enable solar electric systems to meet several unmet needs of solar electric power users which cannot be delivered by state of the art solar photovoltaic or solar concentrating photovoltaic electric power generating devices having no distributed energy storage and control contained therein.

In particular, these unmet needs are to (1.) instantaneously load-follow during power demands that may exceed the power availability from the solar power generating device or aggregate array of solar panels alone, (2.) absorb and store energy that may not be demanded by the connected load on an instantaneous basis but which will be needed on a longer term-basis, (3) provide transient, inrush, or pulse-power demands to the load which may not be possible with the instantaneous peak power limitation of solar array alone, (4.) provide active power-quality filtering which attenuates electrical noise which may be reflected back into the solar power generating array from conditions in connected loads in the grid-interconnected Utility power system, (5.) provide dynamic, power-factor (VAR-injection) correction to the systems connected load or to an interconnected A.C. Grid from within its networks of distributed energy storage and power management electronic sub-systems, (6.) provide greater capacity for peak-shaving or emergency power for a Utility Systems Operator when used in large, integrated, and proximal systems (for example Community Energy Storage CES projects) or large, Utility-scale solar farms, (7) provide sufficient early-warning to a Utility System's operators that a large solar farm feeding their system has unexpectedly reduced its solar-power output because of a passing cloud and has electronically switched to using stored energy. This in turn gives the system's operator time to dispatch compensating power from other system's power assets and avoid an unplanned outage from the solar system. The aggregate distributed energy storage and control described in the present invention when integrated with emerging digital signal processing (DSP) micro-controllers with their large scale, multi-functional integration capabilities, can enable software defined diagnostics and active feedback-control from a large, grid-interned photovoltaic farm offering real-time load-following, transient suppression and VAR-injection making the PV-system a solution to power quality problems as opposed to allowing the solar system to be another source of power quality problems. Finally (8), Control topologies now exist, which when integrated with the micro-controllers of each panel-mounted PV-power element can provide aggregate, instantaneous, power system impedance matching between Utility interconnect points and the PV-system. This function acts as a shock-absorber mitigating the potential for cascading interruptions in feeder networks arising from the "hardconnection" of switch closures (or openings) when bringing the solar farm on or off line. Instantaneous impedance matching and zero-crossover switching capabilities of the described system reduce dangerous "ringing" currents circulating between power feed-sources by making the solar system electrically "invisible" to the larger system.

Functions (4), (5), (6), and (8) listed in the preceding paragraph require the solar system to be configured to use bidirectional power inverters, either if using central power inversion station and DC-only panels or bidirectional microinverters on each panel (which create so called A.C. solar panels) such that in either case sensing A.C. power parameters at the Utility interconnect is enabled. With this bi-directional link available, power-quality sensing and voltage and/or current-shift controlling through the utility interconnect is enabled and can use the sum of the system's collective stored energy to drive (A.C.) power factor correction, attenuation of transient noise, or switching-transient compensating. In like manner, "start-up" through dynamic impedance matching can be achieved when switching a large Utility Scale PV system into or out of a large transmission and distribution network.

While it has been common practice to use centralized battery storage systems with solar-PV systems (especially in off-grid systems), in almost all cases centralized battery banks are more expensive, less safe, and less reliable than using many panel-mounted battery, capacitor, or combination battery and capacitor elements having the collective, equivalent energy storage capacity of the larger central energy storage device. The choice between the use of secondary batteries or electrical capacitors (or combinations of both) depends upon the instantaneous power requirements of the load. In general, battery systems operate ideally to release energy at slower rates of discharge over longer periods of time than may be available to capacitor-only systems.

Capacitor systems on the other hand have several advantages over batteries; 1.) Lower source impedance giving higher instantaneous current availability (orders of magnitude in certain designs) for either charge or discharge, 2.) Very long cycle life, 3.) Inherent control of charging (when charged, the capacitor simply ceases draining current from the circuit) and 4. Less catastrophic failure modes creating fires and explosions. While it is generally true that most electronically controlled devices can only use about one-half of the total stored energy in a capacitor because of their rapid drop in terminal voltage (their stored energy being a function of the square of the storage voltage). In recent years, it has become clear that many power quality problems are of very short duration (microseconds as opposed to minutes) and are ideally solved by a capacitor-stored energy networks. For the same reason, a solar system with distributed capacitive-energy storage could provide enormous pulse power to new generations of weapons now under development. Since solar power systems are inherently more portable than large central generating units, then using solar panels±capacitors represents a very low impedance power source that can be easily configured to contain as many power elements as may be necessary. A battery plus capacitor system can enable such a system to provide very large pulse power 24 hours a day (batteries being the source of capacitor-charging at night when the solar panels are not working).

A preferred embodiment of this invention is to configure the battery packs using cylindrical cells as opposed to prismatic batteries. Smaller cylindrical cell-packs are easier to service (or replace) and will likely always be less costly than large central battery systems constructed flat-prismatic cells because of their inherent ability for higher degrees of automation in manufacture. Some vendors of NiMH and LiFePO4 cylindrical cells have developed multi-spindle, high speed, tape-fed (anode, cathode, and separator materials) winding machines which produce the elemental cell internal assembly at much higher rates (30 to 40 cell assemblies at a time) than individual put/place robotics used in prismatic cell assembly. In 2012, the cost of the very popular "26-660" LiFePO4 cells (26 mm in diameter and 66 mm in length) which are rated at 4 AH-3.2VDC nominal is under $4 each and coming down as usage volume increases. This cell stores ($3.2V \times 4$ AH=12.8 WH of energy) 12.8 watt-hours of energy and 78 of them interconnected will configure a 1-KWH energy module for which the component cost ($4-each) of cells adds up to a battery-component as of $312 (for the 78 required cells). In contrast, present quotations on larger prismatic NiMH or lithium-based batteries range from $800 to $1000 per Kilowatt-Hour of energy storage capacity. In many of the various lithium-based chemistries offered cylindrical package there are promising breakthroughs in secondary battery technologies allowing higher power densities (galvmetric power density), longer cycle lives, reductions in weight (gravmetric power density), more environmental acceptance, and continuous cost reductions over their life cycles. Some types of these rechargeable cells have achieved substantial commercial success (2-billion NiMH "AA" cells sold per year—with similar or greater volumes of lithium-based batteries for cell phones and consumer electronics). As a result of existing and planned large scale manufacturing automation, these cells become more and more cost effective and exhibit longer life and greater inherent safety.

The following conditions favor the use of small (4 AH to 10 AH) cylindrical cells in modular, distributed energy storage systems:

1.) Battery charging and discharging creates heat (exothermic reactions) or absorbs heat (endothermic reactions) according to the electrochemistry chemistry of the redox reactions in each type, and the physics of heat transfer is controlled by three fundamental constants, a.) the thermal conductivity of the materials of the battery, b.) the surface areas through which heating and cooling thermal transfers happen, c.) and the cubic dimensions (the 3-D construction) of the battery cell. The larger the size of the battery (the more cells elements packaged within the 3-D container of the battery) the greater the problem of transferring heat becomes because the surfaces available for heat transfer increase only as a second power (the "square") of the battery dimensions whereas the ability to generate and accumulate heat-energy increases faster because it is driven by the cubic dimensions (the "third power") of the dimensions of the battery. As battery systems increase in size, automotive designers for example, are forced to use expensive forced air or liquid cooling approaches to thermally manage their battery systems.

2.) The present scale-up in cell manufacturing will lead to both cost reductions and performance improvement in energy-cells—which are the building blocks of larger and more complicated energy storage systems. This patent application advocates using smaller numbers of light weight, inexpensive cells per solar element as the unit of energy storage which will be simpler to control, cheaper to build, and inherently safer than using large centralized battery storage as is now the norm in solar systems using energy storage augmentation. The inherent flexibility of deployment of these integrative systems will also provide enormous utility in third-world countries or any off-grid power system by providing modularity for configuring a properly sized electrical solar power system. In third world countries there are large variances in the electrical demands of rural and city power requirements which favor modularity.

3. As more energy becomes concentrated in a single battery container, the inherent safety of the system becomes an overriding, critical consideration. Catastrophic battery failures release very large and dangerous amounts of energy—sometimes explosively and always liberating large quantities of heat energy. Most of these failures start with one-cell and quickly migrate in chain-reaction fashion to adjacent cells and are limited only by the sum of the collected proximal cells—large central batteries can have very dangerous failure modes whereas a failure on a single solar-panel mounted battery is limited by the small size of the battery and the physical isolation of the solar panel within the larger system. In addition, the local sensing of the cell characteristics by the on-board battery management circuit can predict common failures before they occur and electrically disconnect the battery and send a fault-diagnosis signal to a monitoring and control system preventing many probable failures before they occur.

4. There are numerous new battery chemistries under development that promise lower cost and greater levels of energy storage (sodium metal hydride at General Electric and lithium sulfur at Sion Power for example). Some of the modeling in new cell types is very promising for distributed energy storage calculating up to 2,500 WH/Kg which if achieved and incorporated in a one-pound battery pack made from such material, could for example typically store all of the energy to 250 WP solar panel would produce in one day if it were mounted upon the back of the panel. As a practical matter, a Sharp 240 Watt solar panel weighs 41 pounds and has a frame thickness of 46 mm so cylindrical cell packs using the aforementioned 26 mm diameter with its very highly tooled "26-50" configuration (and using high-energy lithium-sulfur "chemistry") would back-mount within the 46 mm depth of the solar panel and not protrude so as to interfere with any traditional mounting systems. Adding a one pound battery to a 41 pound solar panel does not introduce any logistical or handling hardships whereas a large central battery requires a concrete mounting pad and a crane to put it into place.

The system described in this application uses distributed electrical energy storage and sensing/control technologies (for example secondary batteries and/or super-capacitors and associated information-based management and control elements) which may be mounted on individual panels or on convenient groups of panels (so called strings or common physical mounting structures) and when controlled by integrated-logic smart-charge and discharge controllers can provide flexible D.C. power outputs. Such a system could for example be the basic element of a 24 hour solar power system flexibly configured to exactly match local-load requirements. When mated to a bidirectional microinverter such systems can provide expanded power quality control in an AC system through solar-power leveling, transient load following, and long term stored energy for delayed power generation from the so-modified solar electric system. Distributed energy storage also makes an ideal companion to popular A.C. panel systems which use (distributed) unidirectional micro-inverters (D.C. in—A.C. out) to locally convert the D.C. power created by photovoltaic elements to A.C. power to be directly useful to A.C. devices, distribution panels, or to be directly collected by interconnection and exported to large Utilities. As Smart Grids emerge, the bidirectional microinverter option in this invention could use low cost, night-time grid power to recharge the combined, distributed energy storage capacity of the system for the purpose of returning the power at higher feed-in tariffs during the day—thus enhancing their service value and revenue generating potential.

A solar power generation, storage, and control system comprises 25 a solar panel 20, or a plurality of solar panels or solar laminates or an assembly of concentrating PV elements, combined with an associated energy storage system 24 and an electronic control 22 circuit which senses and reports systems' operating parameters and either under internal settings or external control stores and releases energy as Direct Current electrical power 23 as needed and as is available. (see FIG. 1).

Figure 2:
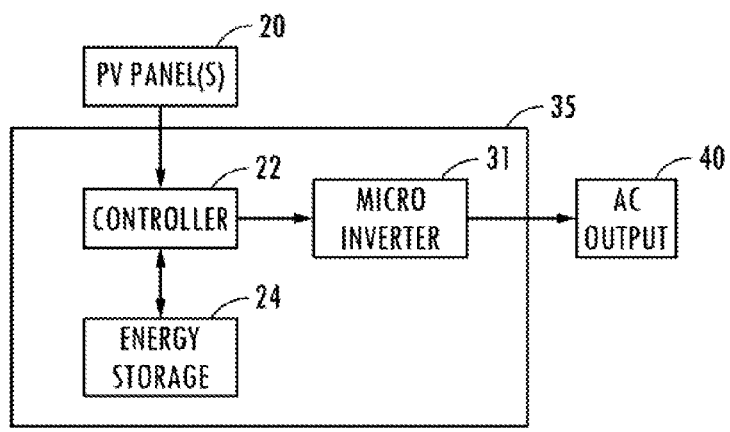
FIG. 2. Shows what the solar industry has named an "A.C. panel" using a microinverter with the novel addition of energy storage and control. This configuration uses power from the combination of the solar panel output and the power from the energy storage module shown as a battery and/or a capacitor system managed by a controller. This novel blending of the solar power with the controlled energy storage module greatly enhances the functionality and value of the system.
Figure 2A:
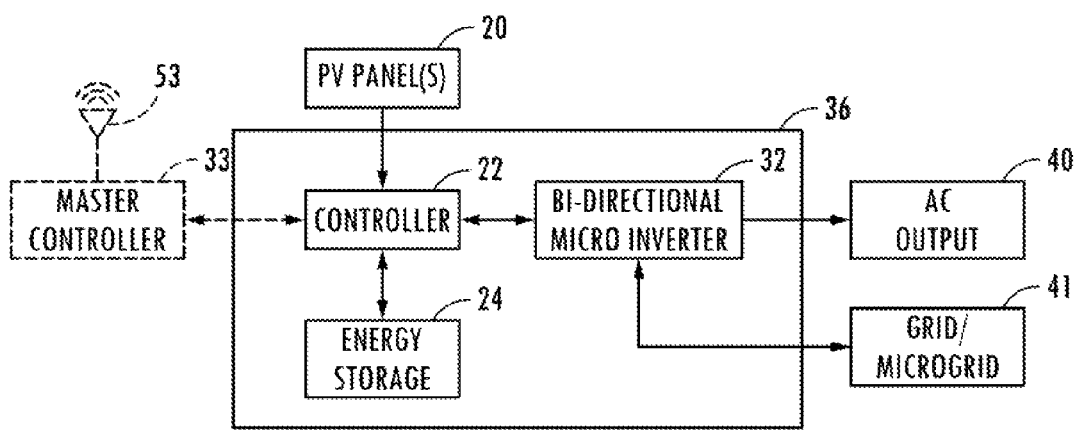
FIG. 2A is a variation on the system as shown in FIG. 2, wherein a bi-directional micro inverter has been added to facilitate bi-directional connection to a grid or micro grid 41, as well as providing AC output 40. A remote Master Controller has also been added. In the FIG. 2A embodiment, an external system "smart-control" master-controller would provide the master control function to dispatch power options—thus giving centralized control of the combined A.C. power output of the micro-power system whereas the simplified version of FIG. 2. eliminates any external, control function and allows local/internal control under various, settable logic control for power needs. For example.

A power generation, storage, and control system 35 comprises a solar panel 20 or a plurality of solar panels or laminates or an assembly of concentrating PV elements, combined with an associated energy storage system 24, a micro-inverter 31 for A.C. output, an electronic control circuit (see FIG. 2) 22 which senses, controls, and reports systems' operating parameters to store and release power as needed or available. In the FIG. 2A view, a bidirectional AC-microinverter 32 replaces unidirectional microinverter 31 and adds an external master controller 33, which communicates through a wireless or wired communications link 53. The resulting bidirectional AC-panel 36 allows a two way power-interaction with 36 with through an external grid-interconnection or a microgrid-interconnection 41.

Figure 3:
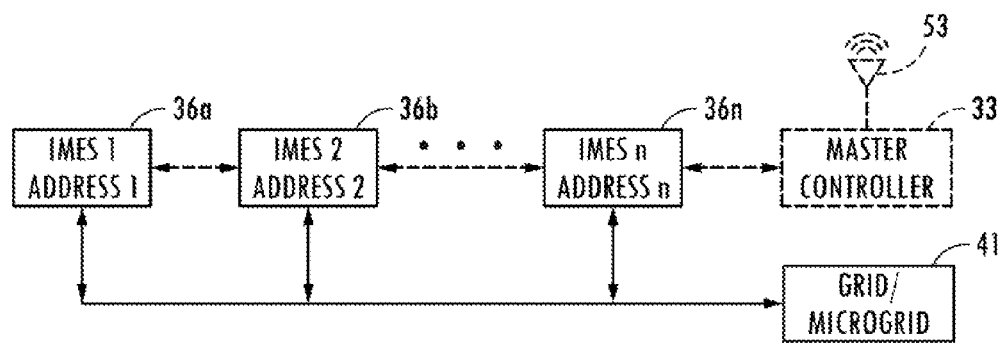
FIG. 3. shows a how a plurality of the FIGS. 1. and 2. systems could be combined in any number to create a fully integrated D.C. system or an A.C. solar farm using individual solar-PV panels with each having both distributed inversion from DC to AC power as well as distributed energy storage and control modules mounted on panels. This design would he employed wherever there is a need for larger overall power requirements. For convenience, these Integrated Microinverter and Energy Storage (IMES) panel systems will synchronize their individual AC outputs and allow direct transformation to grid 41 interconnect switchgear by using combinations of low voltage step-up transformers to feed the high voltage single or three phase grid-interconnect transformer. A direct current configuration of FIG. 1. systems would in turn feed combinations of D.C. to A.C. inverters throughout the larger PV-system.

A power generation, storage, and control system comprises a plurality of A.C. solar panels 36 wired together to form a larger A.C. system with a combined power output 40 having a "Smart Control" control circuit 33 operating through a wireless connection 53 which is either grid connected or part of a micro-grid system. The control-loop senses and reports systems' operating parameters and the instantaneous demand for power and chooses the optimal combination of solar power or stored energy either under internal settings 22 or external control 33, to store and release energy as A.C. electrical power as is needed or available. (see FIG. 3).

Figure 4:
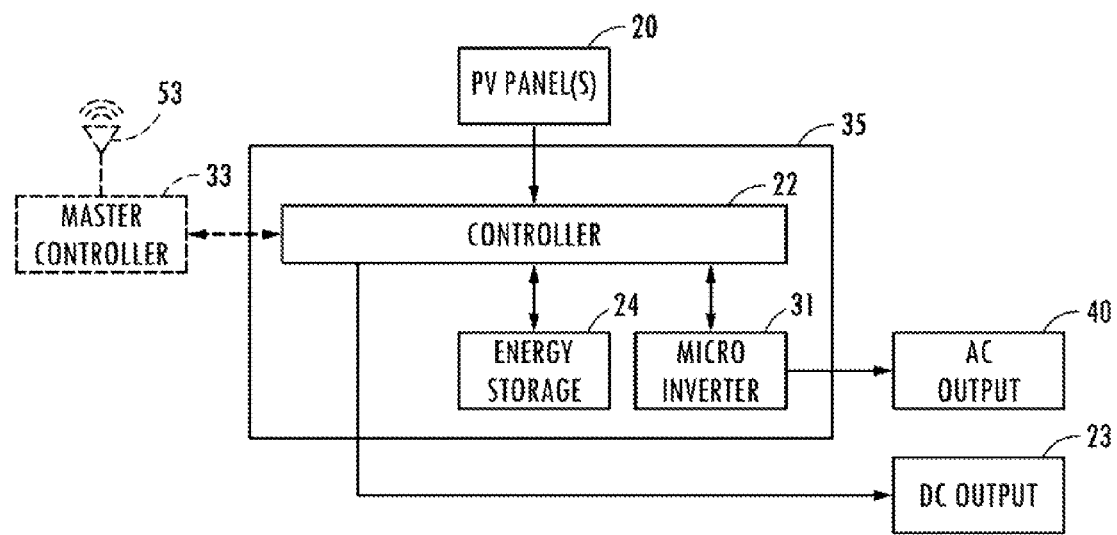
FIG. 4. Illustrates the integration of energy storage, with an A.C. panel, a D.C. output option, all under the control of a wireless central-command protocol. This configuration offers multi-functional power control in a modular building-block configuration.

A power generation, storage, and control system comprises a solar panel 20, or solar laminate, or plurality of solar electric generating elements which is used jointly with and is integrated into a bidirectional micro-inverter 32 and control system 22 of an A.C. panel to provide all of the benefits of distributed, stored energy capacity within a solar electric system with the additional utility of having wireless connectivity 53 to a master control 33. This AC panel may also be configured to provide a controlled D.C. output 23. (see FIG. 4).

Figure 5:
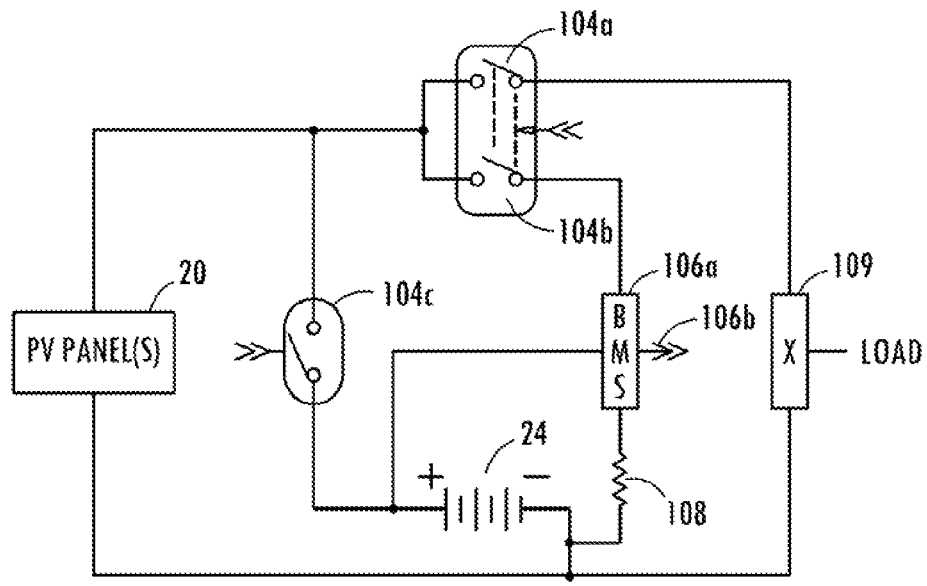
FIG. 5. Depicts an analog representation of the control functions required to proportionally control the output of a solar panel so as to divide both the input and output power flows to either an energy storage element (schematically represented as a battery—but which could be a capacitor) or to an external load.

FIG. 5 illustrates a functional representation of how a high efficiency D.C. power dividing system 104a, 104b would be configured to simultaneously control two flows of power from the single solar panel 20 power source. One line, 104a would service the system's load 109—either delivering D.C. current (or A.C. current if 109 were an inverter), the other line, 104b delivers power to the energy storage 24 through the BMS control 106a. While shown schematically as a battery, 24 is understood to be either a battery and/or a capacitive energy storage system. Switch 104c controls whether the energy storage system is connected to the external load circuit through switch 104a to 109.

Figure 6:
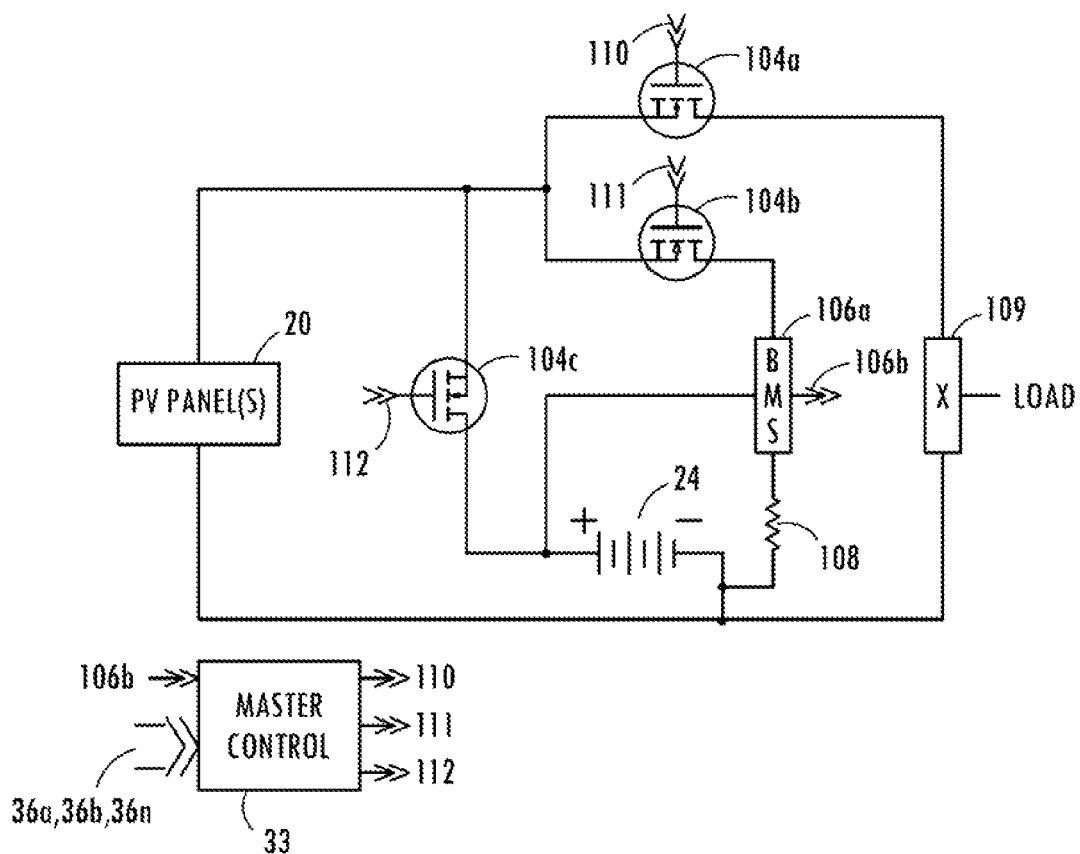
FIG. 6 shows a circuit that could configure the system to pass 60% of its daily solar-power to the external load and save 40% of the power for battery storage so as to allow the system used in the night when the sun has set.

FIG. 6 is a schematic drawing showing one way for an electronic a power dividing circuit between the load 109 and energy storage 24 control systems to function. The pair of MOSFET power transistors serving lines 104a and 104b respectively would be run in the pulse width modulation mode such that their outputs were inversely proportional, for example the "on pulses" into 110 are timed to correspond with the "off pulses" into 111. Under this protocol, as line 104a varies from "off" to "100% on," line 104b would vary inverse proportionally from "100% on" to "off." This is a straightforward programming algorithm for master control 33 and provides for 100% (minus minimal losses) of the power being divided between either the load 109 or to storage 24 at all times while allowing digital control of the power division between the two lines. Transistor 104c would also be controlled 112 in the pulse width modulation mode to discharge the energy storage system. A programmed control signal 112 could disconnect line 104c by turning 104c off for maximum charging rate controlled by loop 106b. A wide variety of other system's operations can be controlled locally or remotely by the many unspecified logic channels and programming of 33 (see FIG. 6).

The system described may be roof mounted or ground mounted, used in residential, commercial, institutional, industrial, or military applications with ubiquitous utility. Essentially every solar electric power source suffers from varying power output for reasons described within this application whereas nearly every electrical load requires constant power consumption at any given time. This invention makes it possible for a solar electric system to load-follow to the extent there has been a systems design that provides enough energy storage to meet statistically determined power requirements over a specified time horizon.

It is to be understood that variations and modifications can be made on the configuration of distribute energy storage without departing from the concepts of the present invention, and that such concepts are intended to be covered by the following claims unless these claims by their language expressly state otherwise.

The invention claimed is:

1. A solar photovoltaic electric system, the system comprising:
   a plurality of solar photovoltaic power collectors;
   an interconnection with an external load;
   a master controller which individually controls a first flow of electric power from a first one of said plurality of solar photovoltaic power collectors to said external load separately from a second flow of electric power from a second one of said plurality of solar photovoltaic power collectors to said external load.

2. The solar photovoltaic electric system of claim 1, further comprising:
   a bidirectional inverter electrically connected between said external load and said first one of said plurality of solar photovoltaic power collectors and between said external load and at least a one electrical energy storage device, wherein the master controller controls a third flow of electric power from said external load to said at least one electrical energy storage devices through said bidirectional inverter.

3. The solar photovoltaic electric system of claim 2 in which the at least one electrical energy storage device comprises an electrical capacitor and other electrical energy storage devices comprise electrical storage cells; said master controller selectively drawing power from said capacitor to meet immediate power needs and from said cells to meet sustained power needs.

4. The solar photovoltaic electric system of claim 3 which is additionally connected to a utility grid; said bidirectional inverter being located between said external load and said first one of said plurality of solar photovoltaic power collectors and between said external load and said at least one energy storage device; said master controller controlling a flow of current to and from said utility grid and said at least one energy storage device, whereby said utility grid functions with said plurality of solar photovoltaic power collectors and said at least one electrical energy storage device to meet power requirements placed on the solar photovoltaic electric system by said external load and by said utility grid when said utility grid requires power.

5. The solar photovoltaic electric system of claim 4 in which said master controller monitors a status of said solar photovoltaic electric system and communicates said status to a utility grid controller associated with said utility grid, wherein the plurality of solar photovoltaic power collectors are connected in strings, which are combined and capable of producing at least 800VDC into megawatt-class inversion stations, or are retrofitted to existing PV-farms enabling distributed energy storage and power quality control in a PV system.

6. The solar photovoltaic electric system of claim 4 in which said master controller provides aggregate, instantaneous, power system impedance matching between said utility grid and said solar photovoltaic electric system.

7. The solar photovoltaic electric system of claim 2 which is additionally connected to a utility grid; said bidirectional inverter being located between said grid and said first one of said plurality of solar photovoltaic power collectors and between said grid and said at least one energy storage device; said master controller controlling a flow of current to and from said utility grid and said at least one energy storage device, whereby said utility grid functions with said power collectors and said at least one electrical energy storage devise to meet power requirements placed on the solar photovoltaic electric system by said load and by said utility grid when said utility grid requires power.

8. The solar photovoltaic electric system of claim 7 in which said master controller monitors a status of said solar photovoltaic electric system and communicates said status to a utility grid controller associated with said utility grid.

9. The solar photovoltaic electric system of claim 7 in which said master controller provides aggregate, instantaneous, power system impedance matching between interconnect points between said utility grid and said solar photovoltaic electric system.

10. The solar photovoltaic electric system of claim 7 in which said master controller provides as needed, distributed, site specific power-factor correction power to said external load.

11. The solar photovoltaic electric system of claim 7 in which said master controller provides VAR-injection to said utility grid.

12. The solar photovoltaic electric system of claim 7 in which said master controller includes digital signal processing (DSP) micro-controllers with large scale, multi-functional integration capabilities connected to said utility grid, providing real-time load following, transient noise suppression and power-factor correction to said utility grid.

13. The solar photovoltaic electric system of claim 12 which includes a telemetry link to utility operators operating said utility grid.

14. The solar photovoltaic electric system of claim 7 in which said master controller includes digital signal processing (DSP) micro-controllers with large scale, multi-functional integration capabilities, providing dynamic impedance matching between the solar photovoltaic electric system and said utility grid when switching said solar photovoltaic electric system into and/or out of connection with said utility grid.

15. The solar photovoltaic electric system according to claim 1 in which said master controller allows two way communication between said master controller and local controller whereby programmed operation of said solar photovoltaic electric system may be established and/or reset by remote access to said local controller.

16. The solar photovoltaic electric system according to claim 1 in which said master controller is connected to a local controller, to facilitate external monitoring of a system performance.

17. The solar photovoltaic electric system of claim 1 comprising: an AC-to-DC inverter between said external load and said first one of said plurality of solar photovoltaic power collectors and the at least one energy storage devices; and in which secondary circuits are provided to rectify and control charging the at least one energy storage device from said utility grid.

18. A solar photovoltaic electric system comprising:
   at least one solar photovoltaic power collector;
   at least one electrical energy storage device;
   an interconnection with an external grid; and
   a controller which controls a first flow of electric power from said at least one solar photovoltaic collector to said external grid and/or the at least one electrical energy storage device, and controls a second flow of electric power from said external grid to said at least one electrical energy storage device.

19. The solar photovoltaic electric system of claim 18 in which at least one electrical energy storage device comprises an electrical capacitor and another electrical energy storage device comprises electrical storage cells; said controller selectively drawing power from said capacitor to meet immediate power needs and from said storage cells to meet sustained power needs.

20. The solar photovoltaic electric system of claim 19 comprising at least one of: an AC-to-DC inverter, an AC-to-DC converter, or an AC-to-DC rectifier, between said external grid and said at least one solar photovoltaic power collector and between said external grid and said at least one energy storage device.

21. The solar photovoltaic electric system of claim 20, wherein a bidirectional AC-to-DC inverter being located between said external grid and said at least one solar photovoltaic power collector and between said external grid said at least one energy storage device, and said controller controlling a flow of current to and from said external grid, whereby said external grid functions with said at least one solar photovoltaic power collector and said at least one electrical energy storage device to meet power requirements placed on the system by an external load when said external load requires power.

22. The solar photovoltaic electric system of claim 21 in which said controller monitors a status of said system and communicates said status to a utility grid controller associated with said external grid.

23. The solar photovoltaic electric system of claim 21 in which said controller rectifies and controls said at least one energy storage device charging from said external grid.

24. An integrated solar photovoltaic system comprising:
   at least one solar photovoltaic panel;
   an electric storage device;
   a bi-directional AC-to-DC inverter capable of inverting DC electric power to an AC load, and inverting AC electric power to the electric storage device from an AC grid; and
   a system controller connected to said at least one solar photovoltaic panel, to said electric storage device, to said bi-directional inverter, and to said AC load to control a flow of electric power from said AC grid to the electric storage device through the bi-directional AC-to-DC inverter.

25. The integrated solar photovoltaic system of claim 24 in which said controller monitors a status of said system and communicates said status to a utility grid controller associated with said AC load.

26. The integrated solar photovoltaic system of claim 24 in which secondary circuits are provided to rectify and control energy storage device charging from said AC grid, wherein the secondary circuits define at least one of: an AC-to-DC inverter, an AC-to-DC converter, or an AC-to-DC rectifier.

27. The integrated solar photovoltaic system of claim 24 in which said controller provides aggregate, instantaneous, power system impedance matching between interconnect points between said AC grid and said photovoltaic electric system.

28. The integrated solar photovoltaic system of claim 24 in which said controller provides as needed, power-factor correction.

29. The integrated solar photovoltaic system of claim 24 in which said controller provides VAR-injection.

30. The integrated solar photovoltaic system of claim 24 in which said controller includes digital signal processing (DSP) micro-controllers with large scale, multi-functional integration capabilities connected to said AC grid and providing real-time load following, transient noise suppression and power-factor (VAR-injection) correction power to said AC grid.

31. The integrated solar photovoltaic system of claim 24 in which said controller includes digital signal processing (DSP) micro-controllers with large scale, multi-functional integration capabilities, providing dynamic impedance matching between the solar power system and said AC grid when switching said solar photovoltaic electric system into and/or out of connection with said AC grid.

32. The integrated solar photovoltaic system of claim 31 in witch said controller allows a system controller at said AC grid to control said controller when the controller is in connection with said AC grid.

33. The integrated solar photovoltaic system of claim 24 in which said electric storage device comprises a capacitor and at least one cell.

34. A photovoltaic system comprising:
   a photovoltaic power source electrically connected to a plurality of electric storage devices which are physically and thermally isolated from one another, but are electrically interconnected to function collectively to store electric energy received from the photovoltaic power source, and to release energy to an electrical load external from the photovoltaic system, wherein the plurality of electric storage devices includes at least one electrochemical battery and at least one capacitor.

35. The photovoltaic system of claim 34 in which said electric storage devices are configure as at least one of: primary batteries and capacitors, secondary batteries and capacitors, or cylindrical cells.

* * * * *